(12) United States Patent
Takahagi et al.

(10) Patent No.: US 10,103,091 B2
(45) Date of Patent: Oct. 16, 2018

(54) SEMICONDUCTOR DEVICE

(71) Applicant: TOYOTA JIDOSHA KABUSHIKI KAISHA, Toyota-shi, Aichi (JP)

(72) Inventors: Satoshi Takahagi, Nagakute (JP); Syou Funano, Toyota (JP); Takuya Kadoguchi, Toyota (JP); Yuji Hanaki, Nagoya (JP); Shingo Iwasaki, Toyota (JP); Takanori Kawashima, Anjyou (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/868,288

(22) Filed: Jan. 11, 2018

(65) Prior Publication Data

US 2018/0261532 A1 Sep. 13, 2018

(30) Foreign Application Priority Data

Mar. 9, 2017 (JP) .................. 2017-044865

(51) Int. Cl.
*H01L 23/495* (2006.01)
*H01L 23/498* (2006.01)
(Continued)

(52) U.S. Cl.
CPC ........ *H01L 23/49582* (2013.01); *H01L 21/48* (2013.01); *H01L 21/56* (2013.01);
(Continued)

(58) Field of Classification Search
CPC ......... H01L 23/49582; H01L 23/49513; H01L 23/49575; H01L 23/49568;
(Continued)

(56) References Cited

U.S. PATENT DOCUMENTS 9,224,662 B2 * 12/2015 Kadoguchi ........... H01L 23/047
9,960,096 B2 * 5/2018 Okumura ................ H01L 25/07
(Continued)

FOREIGN PATENT DOCUMENTS

JP 2012-235081 A 11/2012
JP 2015-053343 A 3/2015
(Continued)

*Primary Examiner* — Dao H Nguyen
(74) *Attorney, Agent, or Firm* — Oliff PLC

(57) ABSTRACT

A semiconductor device may include: a first and a second semiconductor elements each including electrodes on both surfaces thereof; a first and a second metal plates which interpose the first semiconductor element, the metal plates respectively being bonded to the first semiconductor element via first soldered portions; and a third and a fourth metal plates which interpose the second semiconductor element, the metal plates respectively being bonded to the second semiconductor element via second soldered portions; wherein a first joint is provided at the first metal plate, a second joint is provided at the fourth metal plate, the joints are bonded via a third soldered portion, and a solidifying point of the first soldered portions is higher than a solidifying point of the third soldered portion, and a solidifying point of the second soldered portions is higher than the solidifying point of the third soldered portion.

3 Claims, 7 Drawing Sheets

(51) Int. Cl.
- *H01L 23/367* (2006.01)
- *H01L 23/00* (2006.01)
- *H01L 21/48* (2006.01)
- *H01L 21/56* (2006.01)
- *H01L 29/739* (2006.01)
- *H01L 29/861* (2006.01)

(52) U.S. Cl.
CPC ......... *H01L 23/367* (2013.01); *H01L 23/495* (2013.01); *H01L 23/498* (2013.01); *H01L 23/49513* (2013.01); *H01L 23/49524* (2013.01); *H01L 23/49551* (2013.01); *H01L 23/49562* (2013.01); *H01L 23/49568* (2013.01); *H01L 23/49575* (2013.01); *H01L 24/32* (2013.01); *H01L 24/33* (2013.01); *H01L 24/83* (2013.01); *H01L 29/7395* (2013.01); *H01L 29/861* (2013.01); *H01L 2224/29111* (2013.01); *H01L 2224/29144* (2013.01); *H01L 2224/29147* (2013.01); *H01L 2224/32245* (2013.01); *H01L 2224/3303* (2013.01); *H01L 2224/33181* (2013.01); *H01L 2224/33505* (2013.01); *H01L 2224/83211* (2013.01); *H01L 2224/83986* (2013.01)

(58) Field of Classification Search
CPC ......... H01L 23/49551; H01L 23/49562; H01L 23/49524; H01L 23/495; H01L 23/498; H01L 23/367; H01L 24/83; H01L 24/33; H01L 24/32; H01L 21/48; H01L 21/56
USPC ........ 257/666, 675, 676, 692, 712, E23.052, 257/E23.078, E23.01, E21.506, E21.5; 438/123, 122, 107, 612, 613
See application file for complete search history.

(56) References Cited

U.S. PATENT DOCUMENTS

| | | |
|---|---|---|
| 2014/0035112 A1 | 2/2014 | Kadoguchi et al. |
| 2014/0264819 A1* | 9/2014 | Okumura ............ H01L 23/3672 257/712 |
| 2015/0028466 A1* | 1/2015 | Kadoguchi ......... H01L 23/3107 257/676 |
| 2016/0225690 A1 | 8/2016 | Kadoguchi et al. |
| 2016/0315037 A1* | 10/2016 | Kadoguchi ....... H01L 23/49562 |
| 2016/0336251 A1* | 11/2016 | Fukuoka ............. H01L 29/7395 |
| 2017/0018484 A1 | 1/2017 | Kadoguchi et al. |
| 2017/0278774 A1* | 9/2017 | Hayashi ............. H01L 21/4825 |

FOREIGN PATENT DOCUMENTS

| | | |
|---|---|---|
| JP | 2015-170810 A | 9/2015 |
| JP | 2017-107907 A | 6/2017 |

* cited by examiner

SEMICONDUCTOR DEVICE

TECHNICAL FIELD

The technique disclosed herein relates to a semiconductor device. Especially, it relates to a semiconductor device comprising a resin package which seals two semiconductor elements, in which electrodes of the semiconductor elements are respectively bonded, via soldered portions, to metal plates exposed at both surfaces of the resin package.

BACKGROUND

A semiconductor device is known which includes a resin package sealing two semiconductor elements and has metal plates exposed at both surfaces of the resin package as heat diffusing plates. The metal plates are electrically connected to electrodes of the semiconductor elements in the resin package. That is, the metal plates serve as heat diffusing plates as well as electrodes. Such a semiconductor device is described in, for example, Japanese Patent Application Publications No. 2015-170810 and No. 2012-235081. Each of semiconductor elements includes electrodes on both surfaces thereof. Each of the semiconductor elements is interposed between a pair of metal plates, and the metal plates in the pair are respectively bonded to the corresponding electrodes via soldered portions. It should be noted that "an electrode and a metal plate are bonded via a soldered portion" herein includes a case where the electrode and a spacer are bonded via a soldered portion, and the metal plate is bonded to that spacer via another soldered portion on an opposite side with respect to the spacer. The two semiconductor elements are sealed in a resin package. Each pair of the metal plates has a surface of one of the metal plates exposed from the resin package, and this surface serves as a heat diffusing plate. For the sake of simplifying the explanation, the two semiconductor elements will be termed a first semiconductor element and a second semiconductor element, respectively. The pair of metal plates interposing the first semiconductor element therebetween will be termed first and second metal plates, and the pair of metal plates interposing the second semiconductor element therebetween will be termed third and fourth metal plates. The first and third metal plates are exposed at one surface of the resin package, and the second and fourth metal plates are exposed at an opposite surface to the one surface of the resin package. To electrically connect the two semiconductor elements, a first joint is provided at an edge of the first metal plate, a second joint is provided at an edge of the fourth metal plate which is exposed from the resin package on the opposite side to where the first metal plate is exposed, and these joints are bonded by a soldered portion inside the resin package.

SUMMARY

In the aforementioned semiconductor device, soldered portions are interposed between the first and second metal plates, and soldered portions are interposed between the third and fourth metal plates as well. The joints are provided at the respective edges of the first and fourth metal plates which are exposed at the respective surfaces of the resin package, and these joints are bonded by a soldered portion. The soldered portions shrink upon solidifying. The soldered portions shrink between the first and second metal plates, and the soldered portions between the third and fourth metal plates also shrink. If the soldered portion between the joints solidifies before the soldered portions between the metal plates solidify, there may be a risk that the metal plates are tilted when the soldered portions between the metal plates shrink due to the edges of the metal plates being constrained. A technique for suppressing tilt of metal plates caused by shrinkage of soldered portions is being desired.

A semiconductor device disclosed herein may comprise a first semiconductor element and a second semiconductor element, each of the first semiconductor element and the second semiconductor element comprising electrodes on both surfaces thereof. A first metal plate and a second metal plate may interpose the first semiconductor element therebetween, the first metal plate and the second metal plate respectively being bonded to the electrodes of the first semiconductor element via respective first soldered portions. A third metal plate and a fourth metal plate may interpose the second semiconductor element therebetween, the third metal plate and the fourth metal plate respectively being bonded to the electrodes of the second semiconductor element via respective second soldered portions. A resin package may seal the first semiconductor element and the second semiconductor element, the first metal plate and the third metal plate being exposed at one surface of the resin package, and the second metal plate and the fourth metal plate being exposed at an opposite surface to the one surface of the resin package. A first joint may be provided at an edge of the first metal plate, a second joint may be provided at an edge of the fourth metal plate. The first joint may overlap with the second joint as seen along a direction in which the first metal plate and the first semiconductor element are stacked. The first joint and the second joint may be bonded via a third soldered portion. A solidifying point of the first soldered portions may be higher than a solidifying point of the third soldered portion, and a solidifying point of the second soldered portions may be higher than the solidifying point of the third soldered portion.

Further details and improvements of the technique disclosed herein will be described in the below.

DETAILED DESCRIPTION

Figure 1:
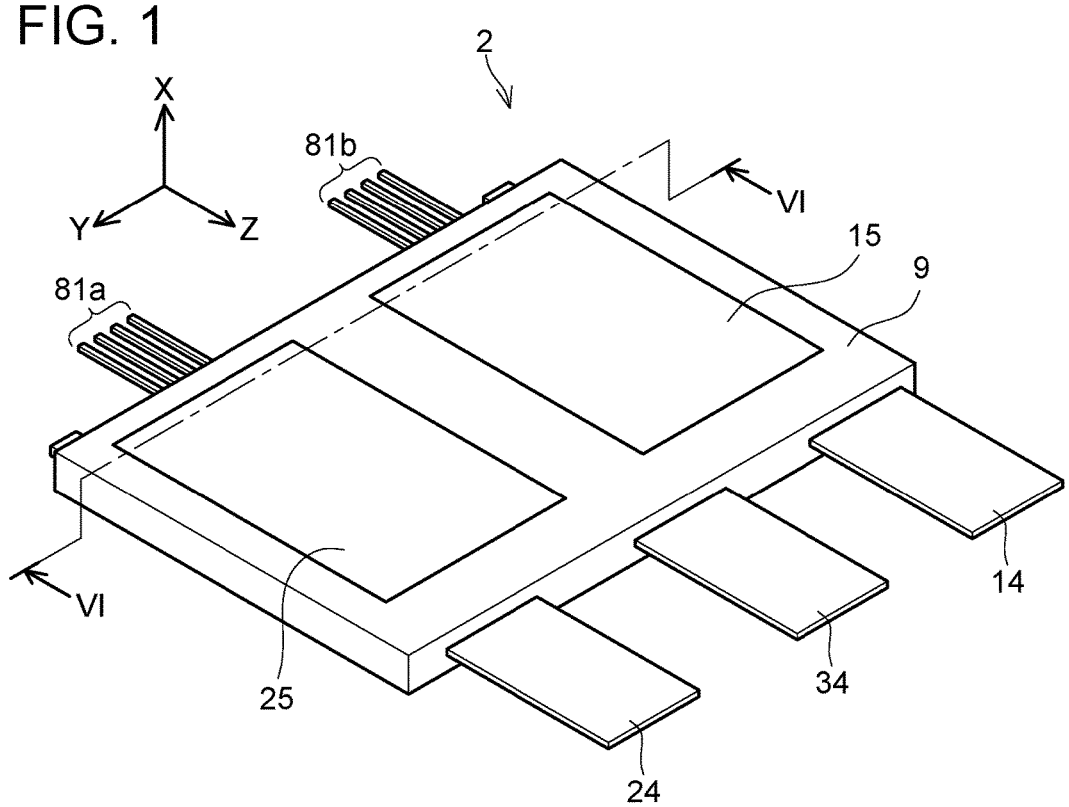
FIG. 1 is a perspective view of a semiconductor device.

In some embodiments, a semiconductor device may comprise a first semiconductor element and a second semiconductor element, each of the first semiconductor element and the second semiconductor element comprising electrodes on both surfaces thereof. A first metal plate and a second metal plate may interpose the first semiconductor element therebetween, the first metal plate and the second metal plate respectively being bonded to the electrodes of the first semiconductor element via respective first soldered portions. A third metal plate and a fourth metal plate may interpose the second semiconductor element therebetween, the third metal plate and the fourth metal plate respectively being bonded to the electrodes of the second semiconductor element via respective second soldered portions. A resin package may seal the first semiconductor element and the second semiconductor element, the first metal plate and the third metal plate being exposed at one surface of the resin package, and the second metal plate and the fourth metal plate being exposed at an opposite surface to the one surface of the resin package. A first joint may be provided at an edge of the first metal plate, a second joint may be provided at an edge of the fourth metal plate. The first joint may overlap with the second joint as seen along a direction in which the first metal plate and the first semiconductor element are stacked. The first joint and the second joint may be bonded via a third soldered portion. A solidifying point of the first soldered portions may be higher than a solidifying point of the third soldered portion, and a solidifying point of the second soldered portions may be higher than the solidifying point of the third soldered portion.

From the aforementioned relationship of the solidifying points, when all of the soldered portions are cooled after heated, the soldered portions (the first and second soldered portions) having the higher solidifying points solidify before the soldered portion (the third soldered portion) having the lower solidifying point. That is, when the aforementioned relationship of the solidifying points is satisfied, the soldered portions between the metal plates (the first and second soldered portions) solidify before the soldered portion between the joints (the third soldered portion) solidifies. Since the metal plates are bonded to the semiconductor elements while the edges of the first and fourth metal plates are free, the metal plates are not tilted.

If a thickness of the third soldered portion is extremely thin, the first joint and the second joint may interfere with each other due to shrinkage of the soldered portions between the metal plates (the first soldered portions or the second soldered portions) upon solidifying. If the first and second joints interfere with each other during the shrinkage of the soldered portions between the metal plates, joint-side edges of the metal plates are constrained, as a result of which the metal plates may be tilted.

Therefore, in solidification, an estimated shrinkage amount of a total sum of thicknesses of the first soldered portions between the first metal plate and the second metal plate may be equal to or less than a thickness of the third soldered portion, and in solidification, an estimated shrinkage amount of a total sum of thicknesses of the second soldered portions between the third metal plate and the fourth metal plate may be equal to or less than the thickness of the third soldered portion. Here, the estimated shrinkage amount means a shrinkage amount (shrinkage amount in a thickness direction) which is estimated when the first soldered portions (the second soldered portions) having a predetermined total sum of thicknesses solidify. The estimated shrinkage amount can be identified by an experiment and the like, if a material and an initial thickness of the soldered portions are known. When the thickness of the third soldered portion is greater than the estimated shrinkage amount of the first soldered portions and the estimated shrinkage amount of the second soldered portions, the joints do not interfere with each other even when intervals between the metal plates are narrowed upon shrinkage of the first soldered portions and the second soldered portions. Thus, the tilt of the metal plates can be prevented.

In order to more surely prevent the tilt of the metal plates due to the interference between the joints, the total sum of the thicknesses of the first soldered portions between the first metal plate and the second metal plate may be equal to or less than the thickness of the third soldered portion, and the total sum of the thicknesses of the second soldered portions between the third metal plate and the fourth metal plate may be equal to or less than the thickness of the third soldered portion. When the aforementioned relationship of the thicknesses is satisfied, the interference between the joints can be surely prevented even if the soldered portions between the metal plates shrink.

EMBODIMENT

Figure 2:
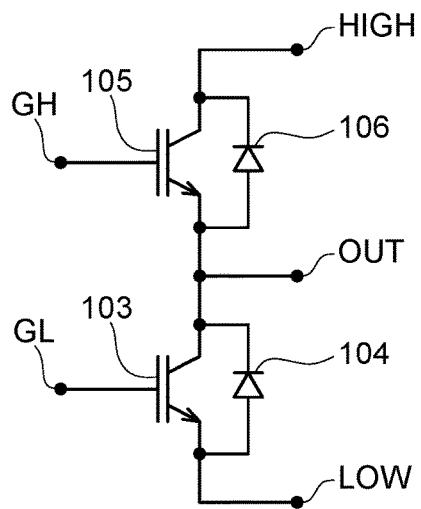
FIG. 2 is an equivalent circuit diagram of the semiconductor device.

A semiconductor device 2 of an embodiment will be described with reference to the drawings. FIG. 1 shows a perspective view of the semiconductor device 2. The semiconductor device 2 is a device in which four semiconductor elements are sealed in a package constituted of resin (resin package 9). An equivalent circuit diagram of the semiconductor device 2 is shown in FIG. 2. The semiconductor device 2 includes a circuit constituted of two transistors 103, 105 and two diodes 104, 106. The two transistors 103, 105 and the two diodes 104, 106 are all power semiconductor elements used for power conversion. Specifically, each of the transistors 103, 105 and the diodes 104, 106 has a current capacity of 100 amperes or more, and is an element used primarily for power conversion. The semiconductor device 2 is typically used in an inverter for generating alternating-current power to be supplied to a drive motor in an electric vehicle, a hybrid vehicle, or a fuel cell vehicle.

The two transistors 103, 105 are connected in series. The diode 104 is connected to the transistor 103 in inverse parallel, and the diode 106 is connected to the transistor 105 in inverse parallel. For the sake of easier explanation, out of terminals on both ends of the serial connection, a terminal connected to a high potential side will be termed a HIGH terminal, and a terminal connected to a low potential side will be termed a LOW terminal. Further, an intermediate point in the serial connection will be termed an OUT terminal. A P terminal 24 in FIG. 1 corresponds to the HIGH terminal, an N terminal 34 in FIG. 1 corresponds to the LOW terminal, and an O terminal 14 in FIG. 1 corresponds to the OUT terminal. Further, a gate terminal GH of the transistor 105 corresponds to one of control terminals 81a in FIG. 1. A gate terminal GL of the transistor 103 corresponds to one of control terminals 81b in FIG. 1. Rest of terminals of the control terminals 81a, 81b are signal terminals for monitoring states of the semiconductor elements, or the like.

As shown in FIG. 1, heat diffusing plates 15, 25 are exposed at one surface of the resin package 9. The heat diffusing plate 15 has its one surface exposed at the one surface of the resin package 9, and has its other surface bonded, inside the resin package 9, to a first transistor element 3 and a first diode element 4 to be described later. The heat diffusing plate 25 has its one surface exposed at the one surface of the resin package 9, and has its other surface bonded, inside the resin package 9, to a second transistor element 5 and a second diode element 6 to be described later. Although cannot be seen in FIG. 1, two heat diffusing plates 12, 22 are exposed at the other surface of the resin package 9. The heat diffusing plates 12, 15, 22, 25 are constituted of conductive metal. More specifically, the heat diffusing plates 12, 15, 22, 25 are constituted of copper. Hereinbelow, when the four heat diffusing plates need to be distinguished from one another, they may respectively be termed the first heat diffusing plate 12, the second heat diffusing plate 15, a third heat diffusing plate 22, and a fourth heat diffusing plate 25.

Figure 3:
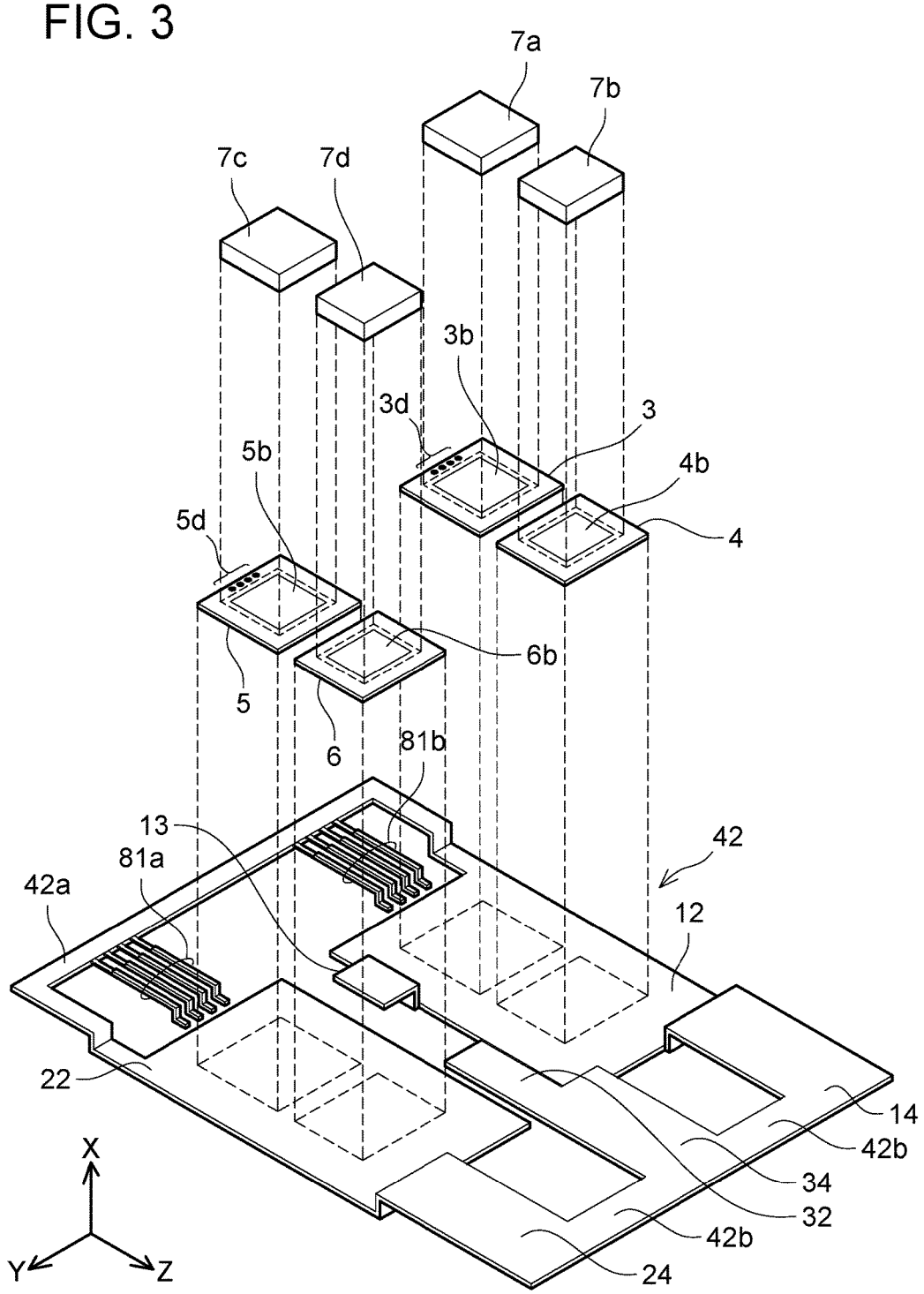
FIG. 3 is a disassembled diagram (1) of the semiconductor device.
Figure 4:
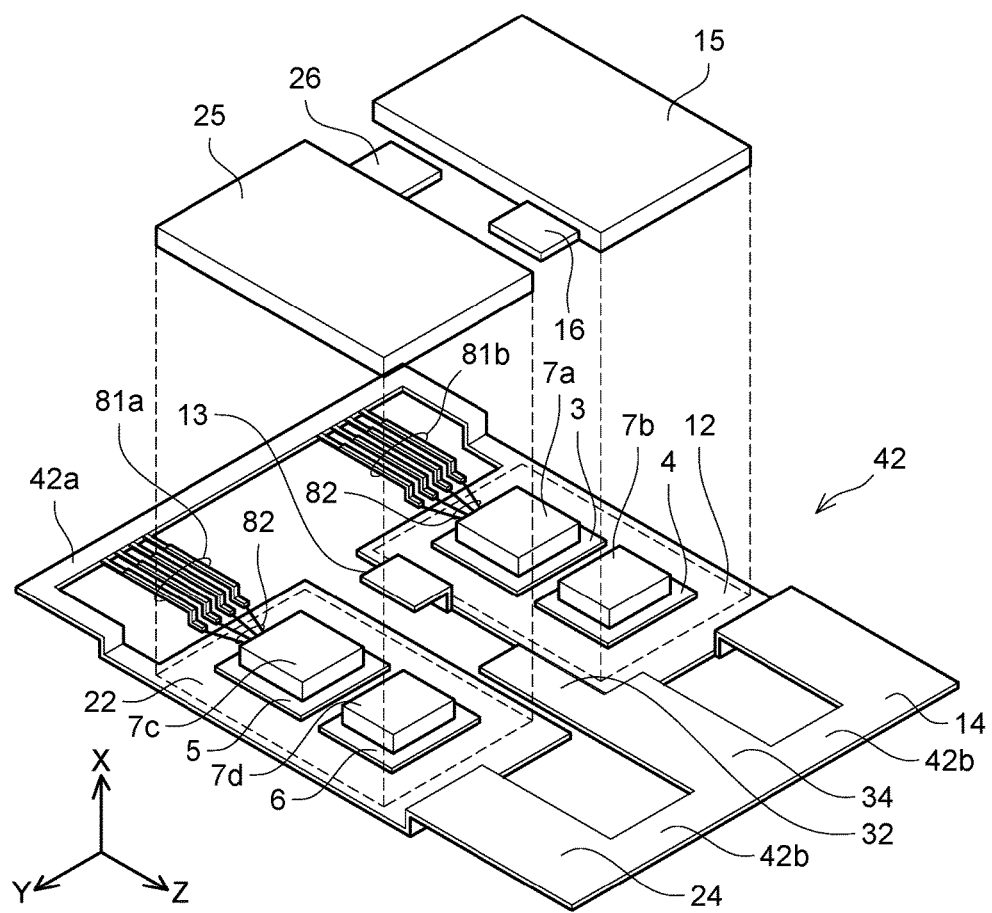
FIG. 4 is a disassembled diagram (2) of the semiconductor device.
Figure 5:
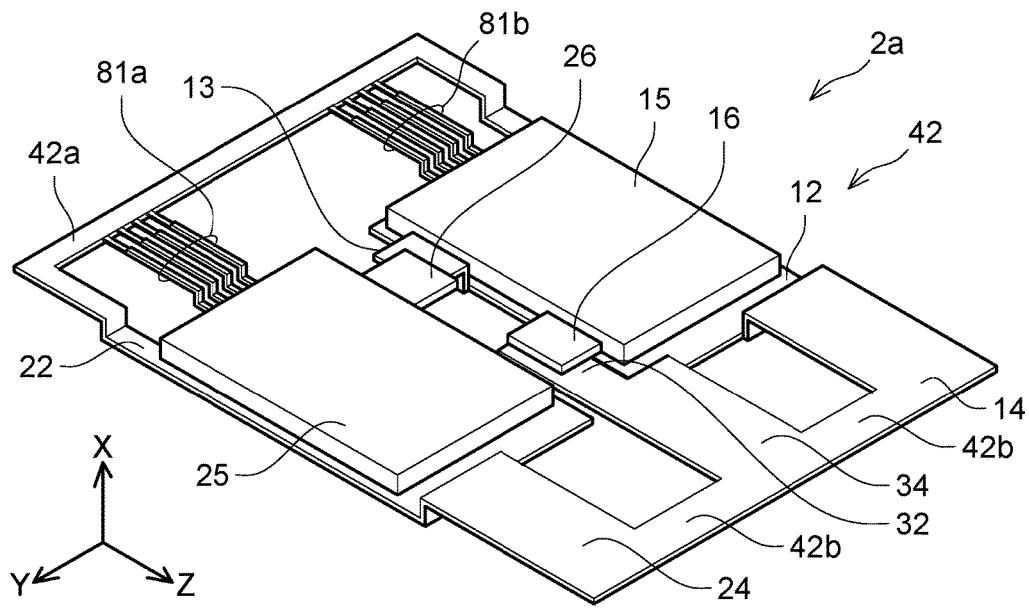
FIG. 5 is a perspective view of an assembly of semiconductor elements and heat diffusing plates.

FIG. 3 is a disassembled view of the semiconductor device 2 omitting the resin package 9 and the heat diffusing plates 15, 25. FIG. 4 is a perspective view in which the heat diffusing plates 15, 25 are detached. FIG. 5 is a perspective view of the semiconductor device 2 omitting the resin package 9 (that is, an assembly 2a of the heat diffusing plates and the semiconductor elements). In FIGS. 3 to 5, the N terminal 34, the P terminal 24, the O terminal 14, and the control terminals 81a, 81b are coupled by runners 42a, 42b, and they constitute one component (lead frame 42). The semiconductor device 2 of FIG. 1 is completed when the runners 42a, 42b are cut off after the resin package 9 has been formed on the assembly 2a of FIG. 5. For the sake of simpler explanation, a positive direction along an X axis of a coordinate system in the drawings will be termed "upward", and a negative direction along the X axis will be termed "downward". In other drawings as well, these expressions regarding "upward" and "downward" may be used.

The two heat diffusing plates (the first heat diffusing plate 12 and the third heat diffusing plate 22) are located at a lowermost side. The O terminal 14 extends from one edge of the first heat diffusing plate 12, and a first joint 13 is provided at another edge thereof. The P terminal 24 extends from one edge of the third heat diffusing plate 22. The N terminal 34 is arranged between the O terminal 14 and the P terminal 24. A joint 32 is provided at an edge of the N terminal 34. As aforementioned, the N terminal 34, the P terminal 24 (the third heat diffusing plate 22), and the O terminal 14 (the first heat diffusing plate 12) are coupled together with the control terminals 81a, 81b by the runners 42a,42b, and their relative positional relationship is fixed in an initial stage.

The first transistor element 3 is stacked on the first heat diffusing plate 12, and is bonded by a soldered portion (not shown). The first diode element 4 is further staked on the first heat diffusing plate 12, and is bonded by a soldered portion (not shown). The first transistor element 3 is a flat plate type, and an electrode is provided on each of its both surfaces. A collector electrode 3a is provided on a lower surface of the first transistor element 3 (see FIG. 6 to be described later), and an emitter electrode 3b is provided on an upper surface of the first transistor element 3. Further, signal terminals 3d including a gate electrode are provided on the upper surface of the first transistor element 3. A cathode electrode is provided on a lower surface of the first diode element 4, and an anode electrode 4b is provided on an upper surface of the first diode element 4. The first heat diffusing plate 12 connects the collector electrode 3a of the first transistor element 3 and the cathode electrode of the first diode element 4. A spacer 7a is bonded to the emitter electrode 3b on the upper surface of the first transistor element 3 via a soldered portion (not shown). A spacer 7b is bonded to the anode electrode 4b on the upper surface of the first diode element 4 via a soldered portion (not shown). The second heat diffusing plate 15 is bonded on the spacer 7a and the spacer 7b via soldered portions (not shown) (see FIG. 4). The second heat diffusing plate 15 connects the emitter electrode 3b of the first transistor element 3 and the anode electrode 4b of the first diode element 4. One ends of bonding wires 82 are bonded to the signal terminals 3d including the gate electrode on the upper surface of the first transistor element 3 (see FIG. 4). Other ends of the bonding wires 82 are bonded to the control terminals 81b.

The second transistor element 5 is stacked on the third heat diffusing plate 22, and is bonded by a soldered portion (not shown). The second diode element 6 is also stacked on the third heat diffusing plate 22, and is bonded by a soldered portion (not shown). The second transistor element 5 is also a flat plate type, and an electrode is provided on each of its both surfaces. A collector electrode 5a is provided on a lower surface of the second transistor element 5 (see FIG. 6 to be described later), and an emitter electrode 5b is provided on an upper surface of the second transistor element 5. Further, signal terminals 5d including a gate electrode are provided on the upper surface of the second transistor element 5. A cathode electrode is provided on a lower surface of the second diode element 6, and an anode electrode 6b is provided on an upper surface of the second diode element 6. The third heat diffusing plate 22 connects the collector electrode 5a of the second transistor element 5 and the cathode electrode of the second diode element 6. A spacer 7c is bonded to the emitter electrode 5b on the upper surface of the second transistor element 5 via a soldered portion (not shown). A spacer 7d is bonded to the anode electrode 6b on the upper surface of the second diode element 6 via a soldered portion (not shown). The fourth heat diffusing plate 25 is bonded on the spacer 7c and the spacer 7d via soldered portions (not shown) (see FIG. 4). The fourth heat diffusing plate 25 connects the emitter electrode 5b of the second transistor element 5 and the anode electrode 6b of the second diode element 6. One ends of bonding wires 82 are bonded to the signal terminals 5d including the gate electrode on the upper surface of the second transistor element 5. Other ends of the bonding wires 82 are bonded to the control terminals 81a.

A joint 16 is provided at an edge of the second heat diffusing plate 15. A second joint 26 is provided at an edge of the fourth heat diffusing plate 25. The joint 16 of the second heat diffusing plate 15 opposes to the joint 32 of the N terminal 34, and is bonded thereto by a soldered portion (not shown). The second joint 26 of the fourth heat diffusing plate 25 opposes to the first joint 13 of the first heat diffusing plate 12, and is bonded thereto by a soldered portion (not shown). The first joint 13 and the second joint 26 overlap each other as seen along a stacking direction of the first heat diffusing plate 12, the first transistor element 3, and the second heat diffusing plate 15 (along an X direction in the drawings), and they are connected by the soldered portion. The circuit shown in FIG. 2 is completed by the above connections. The first transistor element 3 corresponds to the transistor 103 in FIG. 2, and the second transistor element 5 corresponds to the transistor 105 in FIG. 2. The first diode element 4 corresponds to the diode 104 in FIG. 2, and the second diode element 6 corresponds to the diode 106 in FIG. 2.

The resin package 9 is formed around the assembly 2a of FIG. 5. The resin package 9 is formed by inserting the assembly 2a in a mold, and injecting molten resin into the mold. That is, the resin package 9 is formed by resin injection molding. The resin package 9 seals the first transistor element 3, the second transistor element 5, the first diode element 4, and the second diode element 6. The first heat diffusing plate 12 and the third heat diffusing plate 22 are exposed at one surface of the resin package 9, and the second heat diffusing plate 15 and the fourth heat diffusing plate 25 are exposed at an opposite surface of the resin package 9.

As aforementioned, the semiconductor elements such as the first transistor element 3, the heat diffusing plates 12, 15, 22, 25, and the spacers 7a to 7d are bonded by the soldered portions. Depiction of the soldered portions had been omitted in FIGS. 3 to 5. Hereinbelow, the semiconductor elements such as the first transistor element 3, the heat diffusing plates 12, 15, 22, 25, and the spacers 7a to 7d, as well as the soldered portions that bond them will be described with reference to FIG. 6.

Figure 6:
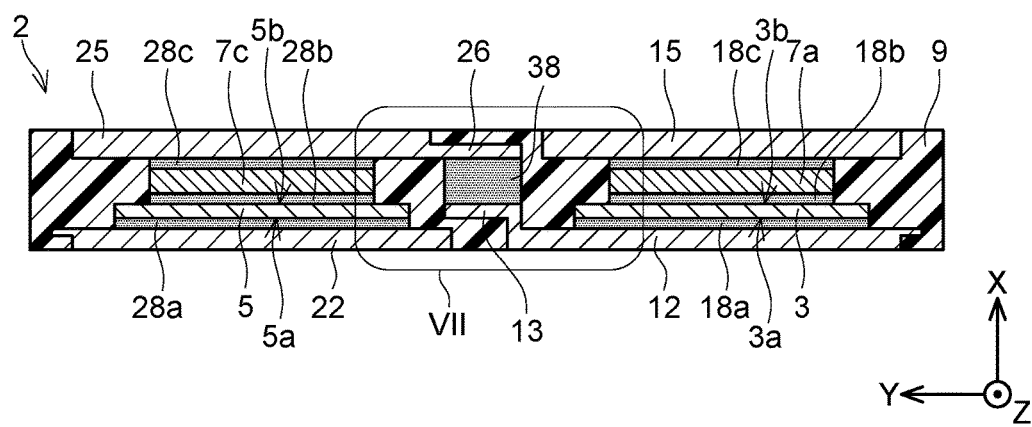
FIG. 6 is a cross sectional view along a VI-VI line in FIG. 1.

FIG. 6 is a cross sectional view along a VI-VI line in FIG. 1. As aforementioned, the collector electrode 3a is provided on the lower surface of the first transistor element 3, and the emitter electrode 3b is provided on the upper surface thereof. The first heat diffusing plate 12 and the collector electrode 3a of the first transistor element 3 are bonded by a soldered portion 18a. The emitter electrode 3b of the first transistor element 3 and the spacer 7a are bonded by a soldered portion 18b. The spacer 7a and the second heat diffusing plate 15 are bonded by a soldered portion 18c. The second heat diffusing plate 15 is bonded to the first transistor element 3 via the soldered portions 18b, 18c and the spacer 7a. The first heat diffusing plate 12 and the second heat diffusing plate 15 interpose the first transistor element 3 in between them, and they are bonded to the electrodes of the first transistor element 3 via the soldered portions 18a, 18b, 18c and the spacer 7a. Hereinbelow, for the sake of simpler explanation, the soldered portions 18a, 18b, 18c existing between the first heat diffusing plate 12 and the second heat diffusing plate 15 that are opposed to each other may collectively be termed first soldered portions 18.

The spacer 7b and the first diode element 4 are also interposed between the first heat diffusing plate 12 and the second heat diffusing plate 15 (see FIGS. 3 to 5). The first diode element 4 and the first heat diffusing plate 12 are bonded by a soldered portion that is of a same material and a same thickness as the soldered portion 18a. The first diode element 4 and the spacer 7b are bonded by a soldered portion that is of a same material and a same thickness as the soldered portion 18b. The spacer 7b and the second heat diffusing plate 15 are bonded by a soldered portion that is of a same material and a same thickness as the soldered portion 18c.

The collector electrode 5a is provided on the lower surface of the second transistor element 5, and the emitter electrode 5b is provided on the upper surface thereof. The third heat diffusing plate 22 and the collector electrode 5a of the second transistor element 5 are bonded by a soldered portion 28a. The emitter electrode 5b of the second transistor element 5 and the spacer 7c are bonded by a soldered portion 28b. The spacer 7c and the fourth heat diffusing plate 25 are bonded by a soldered portion 28c. The fourth heat diffusing plate 25 is connected to the electrode of the second transistor element 5 via the soldered portions 28b, 28c and the spacer 7c. The third heat diffusing plate 22 and the fourth heat diffusing plate 25 interpose the second transistor element 5 in between them, and they are bonded to the electrodes of the second transistor element 5 via the soldered portions 28a, 28b, 28c and the spacer 7c. Hereinbelow, for the sake of simpler explanation, the soldered portions 28a, 28b, 28c existing between the third heat diffusing plate 22 and the fourth heat diffusing plate 25 that are opposed to each other may collectively be termed second soldered portions 28.

The spacer 7d and the second diode element 6 are also interposed between the third heat diffusing plate 22 and the fourth heat diffusing plate 25 (see FIGS. 3 to 5). The second diode element 6 and the third heat diffusing plate 22 are bonded by a soldered portion that is of a same material and a same thickness as the soldered portion 28a. The second diode element 6 and the spacer 7d are bonded by a soldered portion that is of a same material and a same thickness as the soldered portion 28b. The spacer 7d and the fourth heat diffusing plate 25 are bonded by a soldered portion that is of a same material and a same thickness as the soldered portion 28c.

The first joint 13 extends from an edge of the first heat diffusing plate 12, and the second joint 26 extends from an edge of the fourth heat diffusing plate 25. The first joint 13 and the second joint 26 overlap each other as seen along a normal direction of the first heat diffusing plate 12 (along the X direction in the drawings), and are bonded by a soldered portion 38. The soldered portion 38 will be termed a third soldered portion 38 to distinguish it from the first soldered portions 18 and the second soldered portions 28.

Figure 7:
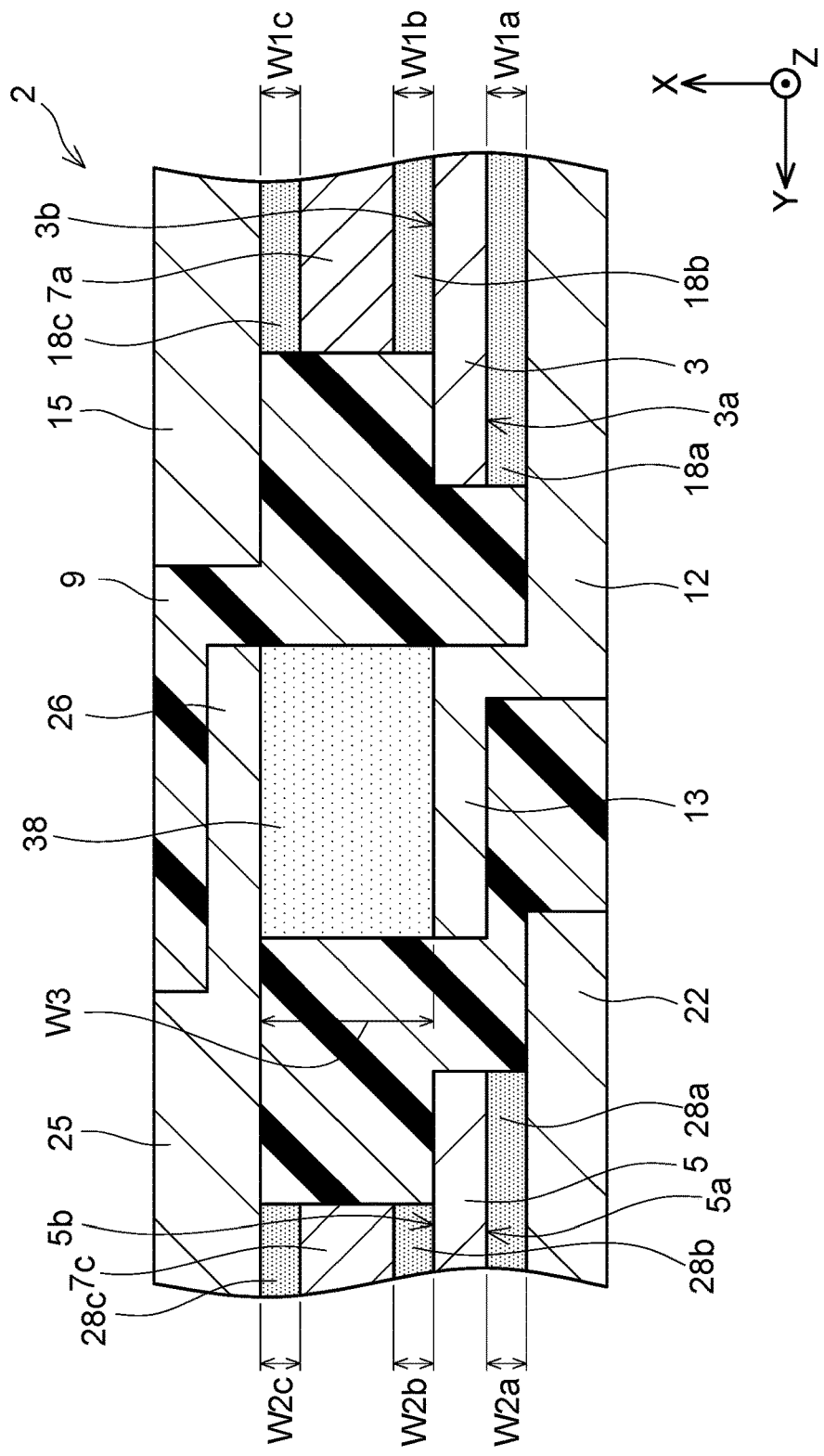
FIG. 7 is an enlarged view of a range indicated by a sign VII in FIG. 6.

An enlarged view of a range indicated by a sign VII in FIG. 6 will be shown in FIG. 7. Signs W1a, W1b, W1c respectively indicate thicknesses of the soldered portions 18a, 18b, 18c. A total thickness W1, which is a total sum of the thicknesses of the first soldered portions 18 between the first heat diffusing plate 12 and the second heat diffusing plate 15, becomes W1=W1a+W1b+W1c. Signs W2a, W2b, W2c respectively indicate thicknesses of the soldered portions 28a, 28b, 28c. A total thickness W2, which is a total sum of the thicknesses of the second soldered portions 28 between the third heat diffusing plate 22 and the fourth heat diffusing plate 25, becomes W2=W2a+W2b+W2c. A sign W3 indicates a thickness of the third soldered portion 38. The thickness W3 of the third soldered portion 38 is thicker than the total thickness W1 of the first soldered portions 18, and is also thicker than the total thickness W2 of the second soldered portions 28. Further, a material different from the first soldered portions 18 and the second soldered portions 28 is used for the third soldered portion 38. A solidifying point T1 of the first soldered portions 18 is higher than a solidifying point T3 of the third soldered portion 38. A solidifying point 12 of the second soldered portions 28 is higher than the solidifying point T3 of the third soldered portion 38. In FIG. 7, the first soldered portions 18 and the second soldered portions 28 having the higher solidifying points are shown by dotted hatching with higher dot density than that of the third soldered portion 38 having the lower solidifying point. For example, Sn-0.7Cu solder material may be used for the first soldered portions 18 and the second soldered portions 28. A solidifying point of this material is 227 degrees Celsius. Further, for example, Sn-3.0Ag-0.5Cu solder material may be used for the third soldered portion 38. A solidifying point of this material is 217 degrees Celsius. A relationship of the aforementioned thicknesses and solidifying points provides the following advantages.

Solder shrinks upon solidifying. Its shrinkage amount along a thickness direction becomes larger when a thickness of the solder is larger. In a case of the structure of FIG. 7, the thickness W3 of the third soldered portion 38 is thicker than the total thickness W1 of the first soldered portions 18 and is also thicker than the total thickness W2 of the second soldered portions 28. If the first soldered portions 18, the second soldered portions 28, and the third soldered portion 38 have a same solidifying point, the soldered portions 18, 28, 38 start shrinking simultaneously during cooling. When this happens, shrinkage of the third soldered portion 38 with the greater thickness brings the first joint 13 and the second joint 26 closer, which causes the first heat diffusing plate 12 and the fourth heat diffusing plate 25 to tilt. However, in the semiconductor device 2 of this embodiment, the first soldered portions 18 and the second soldered portions 28, which are with the smaller thicknesses, solidify before the third soldered portion 38 with the larger thickness. That is, the first soldered portions 18 (that is, the soldered portions between the first and second heat diffusing plates 12, 15 opposed to each other) solidify before the first joint 13 is constrained by bonding with the second joint 26. Similarly, the second soldered portions 28 (that is, the soldered portions between the third and fourth heat diffusing plates 22, 25 opposed to each other) solidify before the second joint 26 is constrained by bonding with the first joint 13. Due to this, the first and second heat diffusing plates 12, 15 opposed to each other are bonded while maintaining their parallelism. Similarly, the third and fourth heat diffusing plates 22, 25 opposed to each other are bonded while maintaining their parallelism.

The relationship of the thicknesses and the solidifying points of the soldered portions in the semiconductor device 2 further brings forth the following advantage. If the third soldered portion 38 with the larger thickness between the joints shrinks and solidifies first, an interval between the first and second heat diffusing plates 12, 15 opposed to each other and an interval between the third and fourth heat diffusing plates 22, 25 opposed to each other become narrowed. When this happens, the first soldered portions 18 and the second soldered portions 28 originally with the smaller thicknesses have to start their shrinkage and solidification after having been thinned down due to the bonding between the joints. As a result of this, their post-bonding thicknesses are further reduced. However, in the semiconductor device 2 of this embodiment, the first soldered portions 18 and the second soldered portions 28 with the smaller thicknesses shrink and solidify before the third soldered portion 38 with the larger thickness, insufficiency in the post-bonding thicknesses can be avoided.

Another advantage obtained from the aforementioned relationship of the thicknesses and the solidifying points of the soldered portions will be described. When the first soldered portions 18 and the second soldered portions 28 shrink and solidify before the solidification of the third soldered portion 38, the interval between the first and second heat diffusing plates 12, 15 is narrowed. Further, the interval between the third and fourth heat diffusing plates 22, 25 is also narrowed. If the thickness of the third soldered portion 38 is thin, an interval between the first joint 13 and the second joint 26 is also narrowed when the intervals between the heat diffusing plates are narrowed, as a result of which there may be a risk that the joints interfere with each other. If the joints interfere with each other, an interval between the joint-side edge of the first heat diffusing plate 12 and the joint-side edge of the fourth heat diffusing plate 25 is constrained. In that state, if the first soldered portions 18 and the second soldered portions 28 shrink further, there may be a risk that the heat diffusing plates are tilted. The tilt of the metal plates due to the interference between the joints can be prevented by making the thickness W3 of the third soldered portion 38 greater than the total thickness W1 of the first soldered portions 18, and greater than the total thickness W2 of the second soldered portions.

As aforementioned, the soldered portions between the diode elements, the heat diffusing plates, and the spacers are same as their corresponding soldered portions between the transistor elements, the heat diffusing plates, and the spacers in terms of the materials and the thicknesses, and as such, the above explanation holds true even when the soldered portions bonding the diode elements are considered.

In FIGS. 6 and 7, the thicknesses of the soldered portions are depicted thicker than they actually are for easier understanding. The thicknesses of the soldered portions are defined within a range of approximately 50 to 500 microns.

Next, a method of manufacturing the semiconductor device 2 will be described. Here, the explanation will start from a step of melting/solidifying the soldered portions by putting the assembly 2a of FIG. 5 (that is, a semi-finished product of the semiconductor device 2 before forming the resin package 9) into a furnace. In this assembly 2a, the soldered portions that have not yet been melted are arranged between the heat diffusing plates, the semiconductor element, and the spacers.

Figure 8:
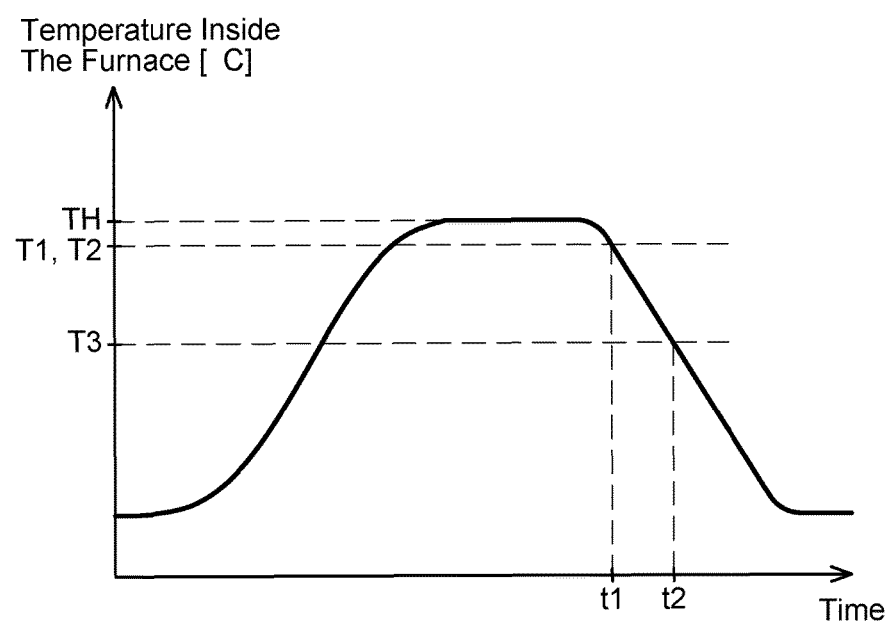
FIG. 8 is a graph showing an example of a temperature profile of a furnace for heating and cooling the assembly of the heat diffusing plates and the semiconductor elements.

FIG. 8 shows a temperature profile of the furnace into which the assembly 2a is to be put. In FIG. 8, a horizontal axis indicates time, and a vertical axis indicates a temperature inside the furnace. Temperature T1 is the solidifying point (melting temperature) of the first soldered portions 18, and temperature T2 is the solidifying point (melting temperature) of the second soldered portions 28. Temperature T3 is the solidifying point (melting temperature) of the third soldered portion 38. Here, the solidifying points and the melting temperatures are supposed as being equivalent for easier explanation.

Firstly, the temperature inside the furnace is raised to a temperature TH, which is higher than the solidifying points (melting temperatures) T1, T2 of the first soldered portions 18 and the second soldered portions 28. All of the soldered portions melt by maintaining the temperature inside the furnace at the temperature TH for a certain period of time. Then, the temperature inside the furnace is decreased. The temperature inside the furnace drops to the solidifying points T1, T2 of the first and second soldered portions 18, 28 at a time t1, and the temperature inside the furnace drops to the solidifying point T3 of the third soldered portion 38 at a time t2. The first soldered portions 18 and the second soldered portions 28 solidify during a period from the time t1 to the time t2. At this timing, the third soldered portion 38 is still melted.

At the time of reaching the time t2, the first soldered portions 18 and the second soldered portions 28 are solidified. The third soldered portion 38 solidifies at the time t2 or later. As above, the third soldered portion 38 solidifies after the first soldered portions 18 and the second soldered portions 28, which have the smaller thicknesses, have solidified. As aforementioned, the first heat diffusing plate 12 and the second heat diffusing plate 15 are bonded while maintaining their parallelism by solidifying the first soldered portions 18 and the second soldered portions 28 with the smaller thicknesses before the third soldered portion 38 with the larger thickness. As explained from another perspective, since the soldered portions between the heat diffusing plates (the first soldered portions 18 and the second soldered portions 28) solidify before the soldered portion between the joints (the third soldered portion), the first heat diffusing plate 12 and the second heat diffusing plate 15 are bonded while maintaining their parallelism before the joint-side edges are constrained. The third heat diffusing plate 22 and the fourth heat diffusing plate 25 are similarly bonded while maintaining their parallelism.

After all of the soldered portions have solidified, the assembly 2a is moved from the furnace into the mold for injection molding, and the resin package 9 is formed. Next, the surface at which the first heat diffusing plate 12 and the third heat diffusing plate 22 are exposed is polished to level surfaces of the first heat diffusing plate 12, the third heat diffusing plate 22, and the resin package 9. Similarly, the surface at which the second heat diffusing plate 15 and the fourth heat diffusing plate 25 are exposed is polished to level surfaces of the second heat diffusing plate 15, the fourth heat diffusing plate 25, and the resin package 9 on the opposite side. At this occasion, since the heat diffusing plates are not tilted, the polishing for achieving level uniformity between the surfaces of the resin package 9 and the heat diffusing plates can be performed at low cost.

As aforementioned, when the semiconductor device 2 is manufactured, the soldered portions between the heat diffusing plates opposed to each other (the first soldered portions 18 and the second soldered portions 28) and the soldered portion between the joints (the third soldered portion 38) do not need to be heated/cooled separately. In manufacturing the semiconductor device 2, the assembly of the first to fourth heat diffusing plates 12, 15, 22, 25 and the semiconductor elements (the transistor elements 3, 5 and the diode elements 4, 6) simply needs to be put into the furnace and heated to a temperature higher than the melting points of all of the soldered portions, and then the temperature of the assembly is brought down to a temperature lower than the solidifying points of all of the soldered portions. In so doing, the soldered portions being thinner ones (the soldered portions with the higher solidifying points) solidify before the other solder portion (the solder portion with the lower solidifying point).

Figure 9:
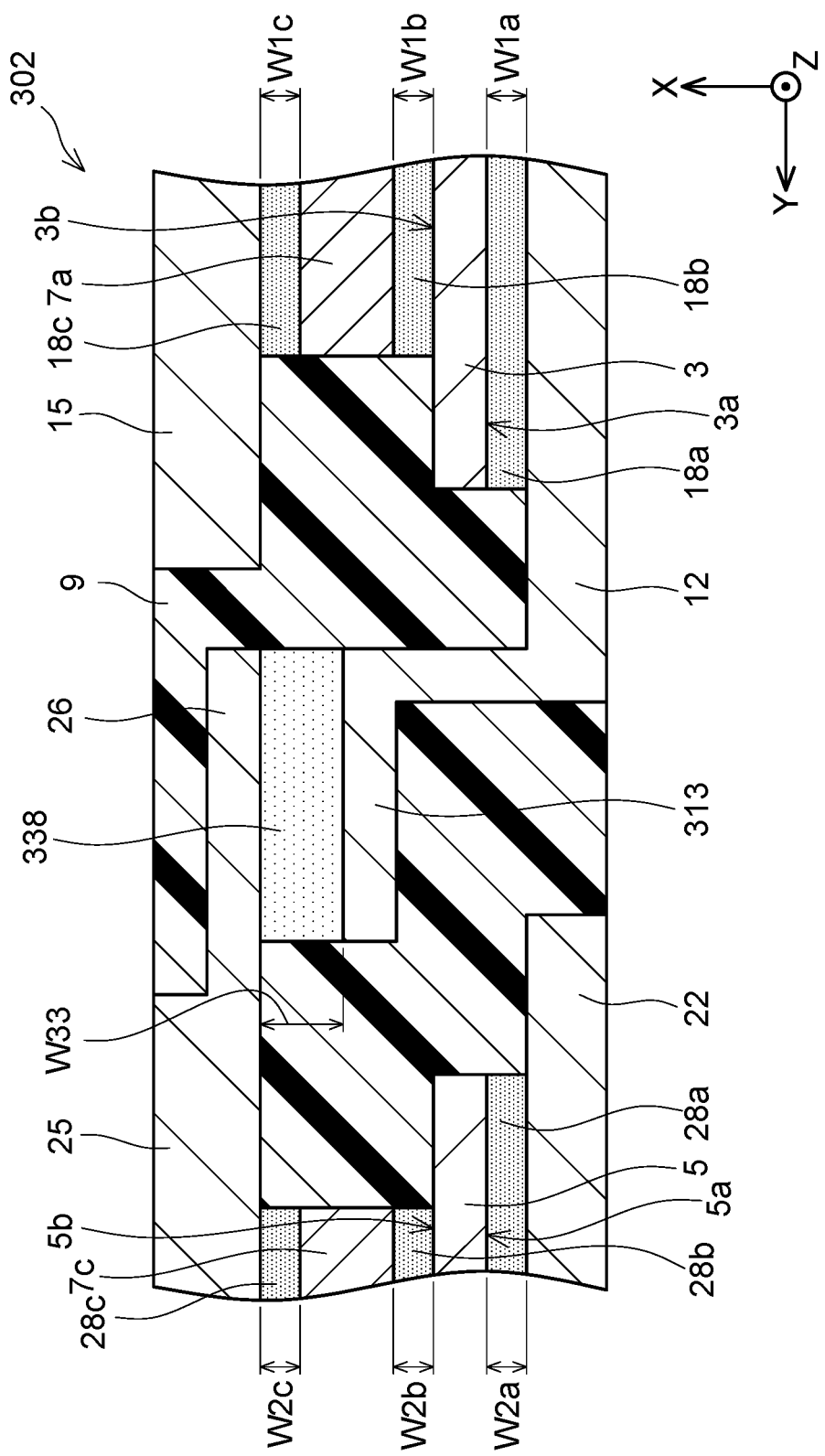
FIG. 9 is a partial cross sectional view of a semiconductor device of a variant.

(Variant) Next, a semiconductor device 302 of a variant will be described with reference to FIG. 9. FIG. 9 is a partial cross sectional view of the semiconductor device 302 of the variant. Hereinbelow, for the sake of simpler explanation, an electrode of a transistor element and a heat diffusing plate being bonded will be expressed as "a transistor element and a heat diffusing plate are bonded". Further, soldered portions between diode elements and heat diffusing plates are same as their corresponding soldered portions between transistor elements and the heat diffusing plates in terms of their materials and thicknesses. Thus, explanation will be omitted for the soldered portions between the diode elements and the heat diffusing plates on both sides thereof.

In this variant, an interval between a first joint 313 and the second joint 26 is narrower as compared to that in the aforementioned embodiment. Other configurations other than the interval are identical to those of the aforementioned embodiment. In FIG. 9, elements identical to the elements of the embodiment in FIG. 7 are denoted with the identical signs. In this variant as well, the solidifying points of the first soldered portions 18 and the second soldered portions 28 are higher than a solidifying point of a third soldered portion 338. To show that, in FIG. 9 as well, the first soldered portions 18 and the second soldered portions 28 having the higher solidifying points are shown by dotting with higher dot density than that of the third soldered portion 338 having the lower solidifying point.

In this variant, a thickness W33 of the third soldered portion 338 is less than the total thickness W1 (=W1$a$+W1$b$+W1$c$) of the first soldered portions 18, and is also less than the total thickness W2 (=W2$a$+W2$b$+W2$c$) of the second soldered portions 28. However, the thickness of the third soldered portion 338 is greater than an estimated shrinkage amount of the total thickness W1 of the first soldered portions 18, and is also greater than an estimated shrinkage amount of the total thickness W2 of the second soldered portions 28. Here, the estimated shrinkage amount means a shrinkage amount (shrinkage amount in the thickness direction) of the total thickness W1 of the first soldered portions 18 (the total thickness W2 of the second soldered portions 28) which is estimated when the first soldered portions 18 (the second soldered portions 28) shrink and solidify. The estimated shrinkage amount can be estimated by an experiment, if a material and an initial thickness of the soldered portions are known. When the thickness W33 of the third soldered portion 338 is greater than the estimated shrinkage amount of the first soldered portions 18 and is greater than the estimated shrinkage amount of the second soldered portions 28, the joints do not interfere with each other even if the intervals between the metal plates are narrowed when the first soldered portions 18 and the second soldered portions 28 shrink and solidify, as a result of which the metal plates are not tilted.

In this variant, for example, W1$a$=W1$b$=W1$c$=W2$a$=W2$c$=W3$c$=W33/2. Then, the estimated shrinkage amount of the total thickness W1 (=W1$a$+W1$b$+W1$c$) of the first soldered portions 18 may be 10% of the total thickness W1. Further, the estimated shrinkage amount of the total thickness W2 (=W2$a$+W2$b$+W2$c$) of the second soldered portions 28 may be 10% of the total thickness W2. In this case, if the thickness W33 of the third soldered portion 338 is [W1$a$×2], the first joint 313 and the second joint 26 do not interfere with each other even when the first soldered portions 18 and the second soldered portions 28 shrink. Therefore, the tilt of the heat diffusing plates can be prevented when the soldered portions shrink.

Points to be noted regarding the technique described in the embodiments will be described. The semiconductor devices 2, 302 of the embodiments interpose a transistor element and a diode element between a pair of the heat diffusing plates 12, 15 (22, 25). In recent years, a semiconductor element that integrates the inverse parallel circuit of the transistor and the diode into one chip is being developed. An example of such a semiconductor element is called RC-IGBT. If the semiconductor element that integrates a transistor element and a diode into one chip is employed, a difference between a bonding area of the heat diffusing plates and the electrodes of the semiconductor elements and a bonding area of the joints becomes smaller. When the difference between the bonding area of the heat diffusing plates and the electrodes of the semiconductor elements and the bonding area of the joints becomes smaller, an influence imposed on tilt of the heat diffusing plates by the bond between the joints becomes prominent. The technique disclosed herein is especially effective for a semiconductor device that interposes one compact semiconductor element between a pair of heat diffusing plates. Further, the highest effect for tilt prevention of the heat diffusing plates can be achieved by configuring the thickness of the soldered portion between the joints (the third soldered portion 38) thicker than those of the soldered portions between the heat diffusing plates (each of the first soldered portions 18 and the second soldered portions 28) as shown in FIGS. 3 to 7.

The first transistor element 3 and the first diode element 4 of the embodiment correspond to an example of a first semiconductor element. The second transistor element 5 and the second diode element 6 of the embodiment correspond to an example of a second semiconductor element. The first heat diffusing plate 12, the second heat diffusing plate 15, the third heat diffusing plate 22, and the fourth heat diffusing plate 25 respectively correspond to an example of a first metal plate, a second metal plate, a third metal plate, and a fourth metal plate.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device comprising:
   a first semiconductor element and a second semiconductor element, each of the first semiconductor element and the second semiconductor element comprising electrodes on both surfaces thereof;
   a first metal plate and a second metal plate which interpose the first semiconductor element therebetween, the first metal plate and the second metal plate respectively being bonded to the electrodes of the first semiconductor element via respective first soldered portions;
   a third metal plate and a fourth metal plate which interpose the second semiconductor element therebetween, the third metal plate and the fourth metal plate respectively being bonded to the electrodes of the second semiconductor element via respective second soldered portions; and
   a resin package sealing the first semiconductor element and the second semiconductor element, the first metal plate and the third metal plate being exposed at one surface of the resin package, and the second metal plate and the fourth metal plate being exposed at an opposite surface to the one surface of the resin package;
   wherein
   a first joint is provided at an edge of the first metal plate,
   a second joint is provided at an edge of the fourth metal plate,
   the first joint overlaps with the second joint as seen along a direction in which the first metal plate and the first semiconductor element are stacked,
   the first joint and the second joint are bonded via a third soldered portion, and
   a solidifying point of the first soldered portions is higher than a solidifying point of the third soldered portion, and a solidifying point of the second soldered portions is higher than the solidifying point of the third soldered portion.

2. The semiconductor device according to claim 1, wherein
   in solidification, an estimated shrinkage amount of a total sum of thicknesses of the first soldered portions between the first metal plate and the second metal plate is equal to or less than a thickness of the third soldered portion, and
   in solidification, an estimated shrinkage amount of a total sum of thicknesses of the second soldered portions between the third metal plate and the fourth metal plate is equal to or less than the thickness of the third soldered portion.

3. The semiconductor device according to claim 2, wherein
   the total sum of the thicknesses of the first soldered portions between the first metal plate and the second metal plate is equal to or less than the thickness of the third soldered portion, and
   the total sum of the thicknesses of the second soldered portions between the third metal plate and the fourth metal plate is equal to or less than the thickness of the third soldered portion.

* * * * *